(12) United States Patent
Freerks et al.

(10) Patent No.: US 6,709,218 B1
(45) Date of Patent: Mar. 23, 2004

(54) ROBOT BLADE FOR SEMICONDUCTOR PROCESSING EQUIPMENT

(75) Inventors: Frederik W. Freerks, Cupertino, CA (US); Tetsuya Ishikawa, Santa Clara, CA (US); Timothy Y. Wang, San Jose, CA (US); Jeffrey C. Hudgens, San Francisco, CA (US); James R. Ciulik, Austin, TX (US); Mohsen Salek, Cupertino, CA (US); Tim Leong, Danville, CA (US); Al DiFrancesco, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 451 days.

(21) Appl. No.: 09/324,889

(22) Filed: Jun. 3, 1999

Related U.S. Application Data

(63) Continuation-in-part of application No. 08/801,076, filed on Feb. 14, 1997, now Pat. No. 5,955,858.

(51) Int. Cl.[7] .............................................. B65G 49/07
(52) U.S. Cl. ............. 414/217; 414/225.01; 414/416.01; 414/416.11; 414/937; 414/939; 414/941
(58) Field of Search .................. 414/935, 937, 414/939, 941, 403, 416, 222.01, 217; 118/719

(56) References Cited

U.S. PATENT DOCUMENTS

| | | | |
|---|---|---|---|
| 4,184,188 A | 1/1980 | Briglia | 361/234 |
| 4,586,743 A | 5/1986 | Edwards et al. | 294/86.4 |
| 4,705,951 A | 11/1987 | Layman et al. | 250/442.1 |
| 4,733,632 A | 3/1988 | Ohmi et al. | 118/729 |
| 4,813,732 A | 3/1989 | Klem | 294/103.1 |
| 4,962,441 A | 10/1990 | Collins | 361/234 |
| 5,022,695 A | 6/1991 | Ayers | 294/88 |
| 5,133,635 A | 7/1992 | Malin et al. | 414/744.8 |

(List continued on next page.)

FOREIGN PATENT DOCUMENTS

| | | | |
|---|---|---|---|
| EP | 0423608 A1 | 4/1991 | |
| EP | 0 423 608 A1 | 4/1991 | ............... B25J/9/12 |
| EP | 0 445 651 A2 | 9/1991 | ............ H01L/21/00 |
| EP | 0777264 A1 | 6/1997 | |
| EP | 0 793 262 A2 | 9/1997 | ............ H01L/21/00 |

OTHER PUBLICATIONS

U. S. Patent Application Entitled: "Substrate Clamping Apparatus," Ser. No. 08/935,293; Filing Date: Sep. 22, 1997; Inventors: Ebbing et al.

U.S. Patent Application Entitled: "Mechanical Gripper for Wafter Handling Robots," Ser. No. 09/283,995; Filing Date Apr. 1, 1999; Inventors: Satish Sundar, et al.

PCT International Search Report Dated May 1, 1999.

U.S. patent application Ser. No. 09/084,200, filed May 21, 1998.

Japan Abstract 2–80566.

Sundar, Satish, "Improved Throughput Using Time–Optimal Motion Planning and Design".

*Primary Examiner*—Steven A. Bratlie
(74) *Attorney, Agent, or Firm*—Moser Patterson & Sheridan

(57) ABSTRACT

The present invention generally provides a robot blade which provides a plurality of semi-conductive or conductive contacts disposed at least partially on the surface of the blade to support a substrate above the blade. The contacts are preferably located inwardly from the edge of the blade and toward the center of the blade to provide a collection area on the blade to capture any particles which may form. The blade is preferably made of a semi-conductive material, such as alumina or other semi-conductive material, to provide an electrical flow path through the contact(s) to discharge any electrical charge which may build up on the substrate during processing.

23 Claims, 8 Drawing Sheets

U.S. PATENT DOCUMENTS

| | | | |
|---|---|---|---|
| 5,180,276 A | 1/1993 | Hendrickson | 414/752 |
| 5,280,983 A | 1/1994 | Maydan et al. | 294/119.1 |
| 5,324,155 A | 6/1994 | Goodwin et al. | 414/225 |
| 5,352,294 A | 10/1994 | White et al. | 118/725 |
| 5,374,147 A | 12/1994 | Hiroki et al. | 414/217 |
| 5,380,137 A * | 1/1995 | Wada | 414/937 XY |
| 5,445,486 A * | 8/1995 | Kitayama et al. | 414/937 XY |
| 5,447,409 A | 9/1995 | Grunes et al. | 414/744.6 |
| 5,469,035 A | 11/1995 | Lowrance | 318/568.1 |
| 5,494,523 A | 2/1996 | Steger et al. | 118/723 E |
| 5,516,367 A | 5/1996 | Lei et al. | 118/725 |
| 5,540,098 A * | 7/1996 | Ohsawa | 414/937 XY |
| 5,645,391 A * | 7/1997 | Ohsawa et al. | 414/937 XY |
| 5,645,646 A | 7/1997 | Beinglass et al. | 118/730 |
| 5,647,626 A | 7/1997 | Chen et al. | 294/87.1 |
| 5,702,228 A | 12/1997 | Tamai et al. | 414/744.5 |
| 5,711,646 A * | 1/1998 | Ueda et al. | 414/941 XY |
| 5,720,590 A | 2/1998 | Hofmeister | 414/744.2 |
| 5,733,096 A | 3/1998 | Van Doren et al. | 414/744.3 |
| 5,885,353 A | 3/1999 | Strodtbeck et al. | 118/712 |
| 5,904,779 A | 5/1999 | Dhindsa et al. | 118/723 E |
| 5,935,338 A | 8/1999 | Lei et al. | 118/725 |
| 5,935,397 A | 8/1999 | Masterson | 204/298.12 |

* cited by examiner

ROBOT BLADE FOR SEMICONDUCTOR PROCESSING EQUIPMENT

This application is a continuation-in-part of U.S. application Ser. No. 08/801,076, entitled "Mechanically Clamping Robot Wrist", filed on Feb. 14, 1997, now U.S. Pat. No. 5,955,858 and claims priority thereto.

BACKGROUND OF THE INVENTION

1. Field of the Invention

The present invention relates to an apparatus and method for transferring objects in a processing system. More specifically, the present invention relates to a robot blade made of a dielectric or semi-conducting material that reduces particulate contamination and substrate contact on a blade surface.

2. Background of the Related Art

Modern semiconductor processing systems typically integrate a number of process chambers on a single platform to perform several sequential processing steps without removing the substrate from a highly controlled processing environment. Once the cluster tool has been configured with the requisite number of chambers and auxiliary equipment for performing certain process steps, the system will typically process a large number of substrates by moving the substrates through the chambers using a robot disposed in the system. The robot provides both lateral and rotational movement of a substrate on a robot blade to retrieve, transfer, and deliver substrates from one location within the system to another. Two examples of robots include a frog-leg type robot and a polar type robot. FIG. 1 illustrates a frog-leg type robot 2 having blades 4a and 4b. FIG. 2 illustrates a polar-type robot 6 having a blade 8 supporting a substrate 12.

To increase throughput rates of substrates in a processing system, the trend is to increase the speeds at which substrates are moved in the system by the robot. However, increased speeds add complexity to the substrate handling systems and have resulted in several challenges. First, increased speeds have decreased the acceptable tolerances which are required to maintain repeatability and quality of substrate handling. The desire for speed and increased throughput rates are balanced against the possibility of damaging substrates or the films formed thereon. Typically, the substrate is held in place on a robot blade by the substrate weight and frictional contact with the blade. If a robot moves a robot blade too abruptly, or rotates the blade too fast, then the substrate may slide off the blade, potentially damaging the substrate, the chamber, and/or the robot.

One solution that addresses this problem and enables faster blade movement has been to use a clamping device, typically referred to as a gripper, to secure the substrate on the robot blade. FIGS. 3 and 4 are a top view and cross sectional view, respectively, showing a typical robot blade 10 connected to a robot 2 and having a pair of extendable substrate grippers 13a, 13b associated therewith. When a substrate 12 is received on a robot blade, the grippers 13a, 13b are extended from lateral shoulder 14 to secure a substrate between the grippers and a lateral shoulder 16. As the grippers are extended, the substrate 12 slides along a first vertical support 18 and a second vertical support 20 and into engagement with the lateral shoulder 16. The vertical supports 18, 20 are typically beveled as shown in FIGS. 5 and 6 to reduce the contact area between the substrate 12 and the respective vertical support as the substrate slides across the vertical supports into position. The movement of the substrate 12 across the vertical supports 18, 20 can generate particles which can accumulate on the edge of a substrate 12 or on the robot blade 10. Particles typically accumulate in area 17 between the lateral shoulders 14, 16 and their respective vertical supports 18, 20 as shown in FIGS. 5 and 6. If particles adhere to or are otherwise received on a substrate, the particles can cause defects on the substrate, thereby reducing the device yield of the substrate. Particles can also be transferred to other locations within a processing system and can compromise the integrity of system components such as vacuum chucks and electrostatic chucks.

In addition to holding a substrate on a blade, increasing automated substrate transfer speeds challenge acceptable tolerances related to blade deflection. Blade deflection refers to the stiffness of the blade and the associated droop of the blade experienced during movement within the system. During substrate handling, the blade deflects due to forces acting on the blade and the substrate. For example, when a substrate is loaded on the blade, the blade deflection can change depending on the speed of substrate movement, substrate mass, wear of robot/blade components, and chamber temperature. The amount of deflection can be critical because substrates are typically stored in cassettes in a stacked configuration and it is important to accurately maintain the position of the blade as the blade enters the cassette, retrieves a substrate, and exits the cassette. The same accurate positioning is needed to control delivery of a substrate into and out of a processing chamber. As the robot speed increases, the amount of blade deflection is desirably reduced to provide tighter tolerances to ensure that the blade and/or substrate will not be damaged during movement or placement within the system.

Another problem encountered in the transfer of substrates in a processing system is electrostatic charge that can build up on a substrate and, if not discharged, can cause a substrate to adhere to a robot blade. Typically, an electrostatic charge can be created on a substrate surface as a result of processing or as a result of being held to a support member on an electrostatic chuck. Another source of an electrostatic charge includes substrate cassettes which support substrates during transfer within a fabrication. While an electrostatic charge is beneficial for holding the substrate temporarily during a processing step, a residual build up of an electrostatic charge on a substrate may cause an attraction of the substrate to the robot blade or otherwise hinder efficient transfer of the substrate from chamber to chamber. In addition, an electrostatic charge can also attract particles to the substrate, causing contamination of the substrate and subsequent yield loss.

The robot is typically grounded. While it is desirable to reduce the electrostatic charge on a substrate, current blades made of aluminum or other highly conductive material can cause arcing between a conductive blade and a substrate when dissipating an electrostatic charge through the grounded robot. Arcing can cause defects in the delicate patterns developed on a substrate. Thus, while it is preferable to reduce the electrostatic charge on the substrate, the charge should not be discharged through a highly conductive electrical path which can cause arcing.

There remains a need for a robot blade that reduces the risk of contamination in substrate processing, reduces the blade deflection, and dissipates at least some of the electrostatic charge which may build up on a substrate.

SUMMARY OF THE INVENTION

The present invention generally provides a robot blade which provides a plurality of semi-conductive or conductive contacts disposed at least partially above the surface of the blade to support a substrate above the blade. The contacts are preferably located inwardly from the edge of the blade and toward the center of the blade to provide a collection area on the blade for particles to accumulate. The blade is preferably made of a ceramic, such as semi-conductive alumina or other semi-conductive material to provide an electrical flow path through the contact(s) to discharge any electrical charge which may build up on the substrate during processing.

In one aspect, the invention provides a robot blade, comprising a body having a blade surface and a plurality of conductive or semi-conductive contacts disposed at least partially on the blade surface. In another aspect, the invention provides a substrate processing system, comprising a chamber, a robot disposed in the chamber and a robot blade connected to the robot, the robot blade comprising a body having a blade surface and a plurality of conductive or semi-conductive contacts disposed at least partially on the blade surface. In another aspect, the invention provides a method of moving a substrate, comprising supporting a substrate on a plurality of at least semi-conductive contacts disposed on a blade surface, engaging a substrate with at least one biasing member, and moving the substrate in a processing system.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1:
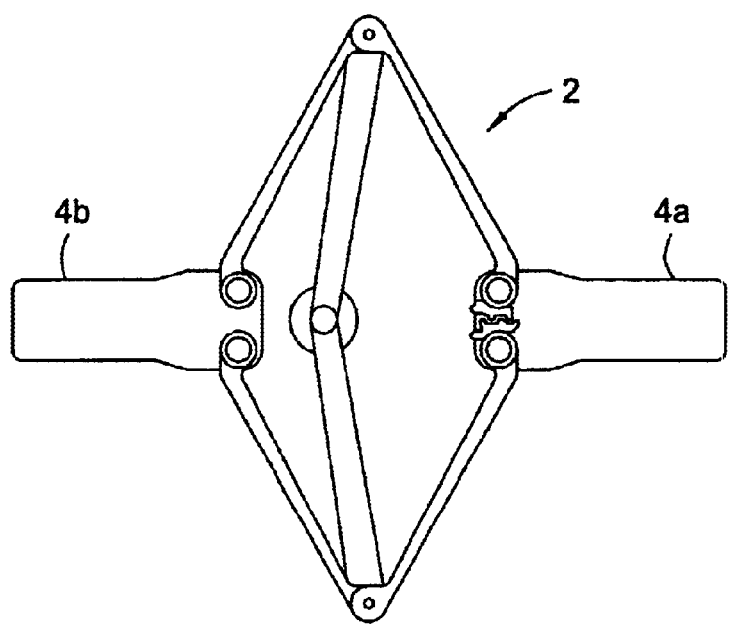
FIG. 1 is a schematic-top view of a double blade frog-leg type robot.
Figure 2:
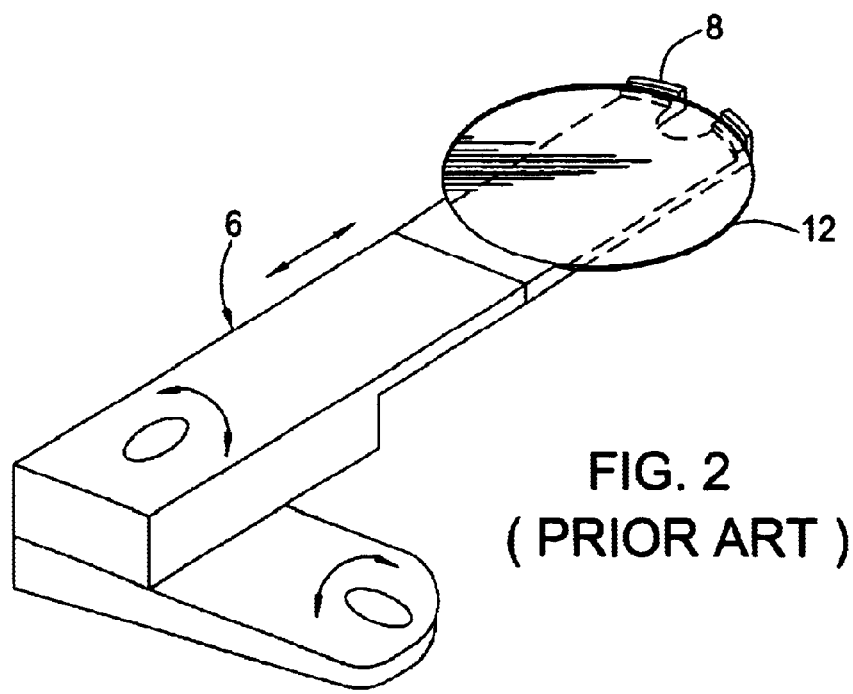
FIG. 2 is a schematic perspective view of a polar type robot.
Figure 3:
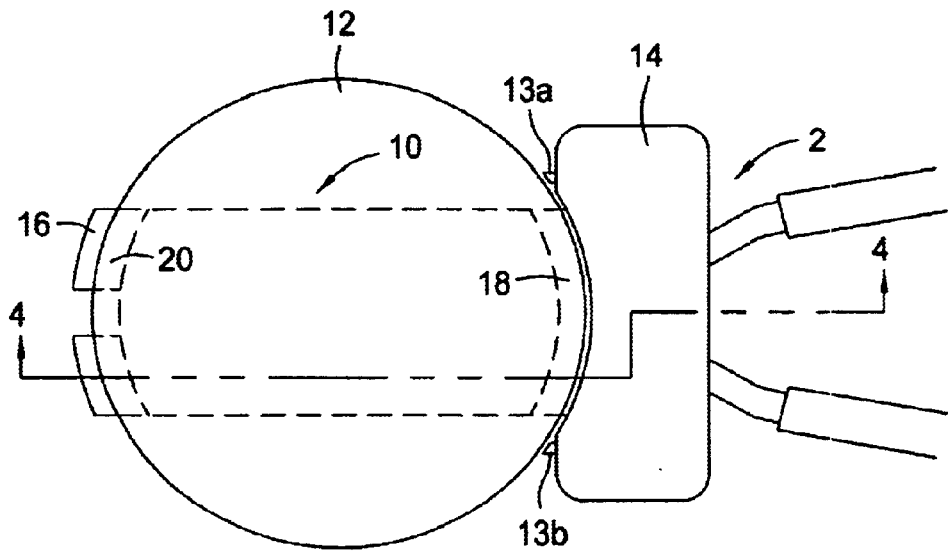
FIG. 3 is a schematic top view of a typical robot blade with a gripper.
Figure 4:
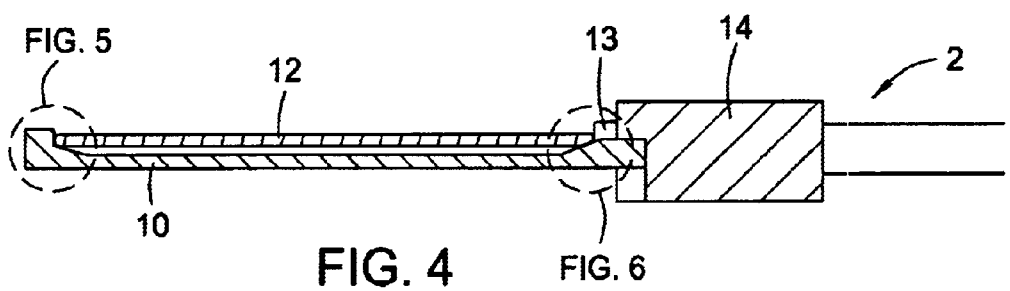
FIG. 4 is a schematic cross sectional view of the embodiment of FIG. 3.
Figures 5, 6:
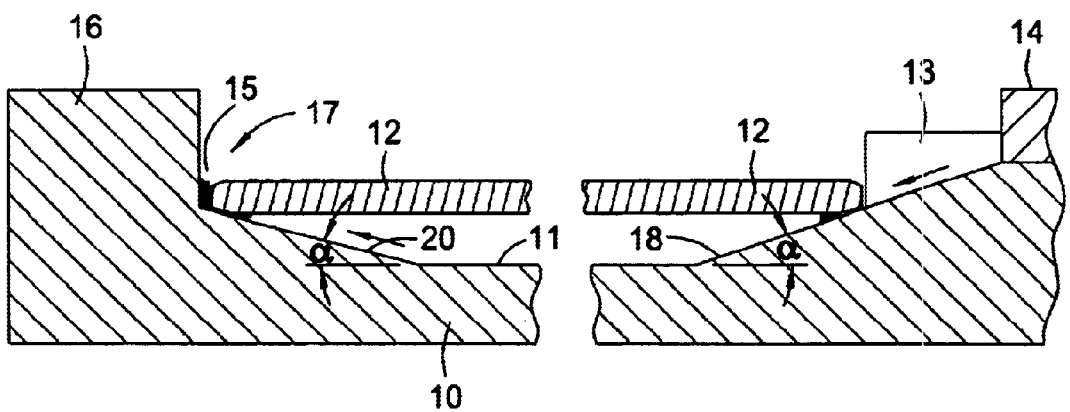
FIG. 5 is a schematic cross sectional view of the embodiment of FIG. 4.
FIG. 6 is a schematic of another cross sectional view of the embodiment of FIG. 4.
Figure 7:
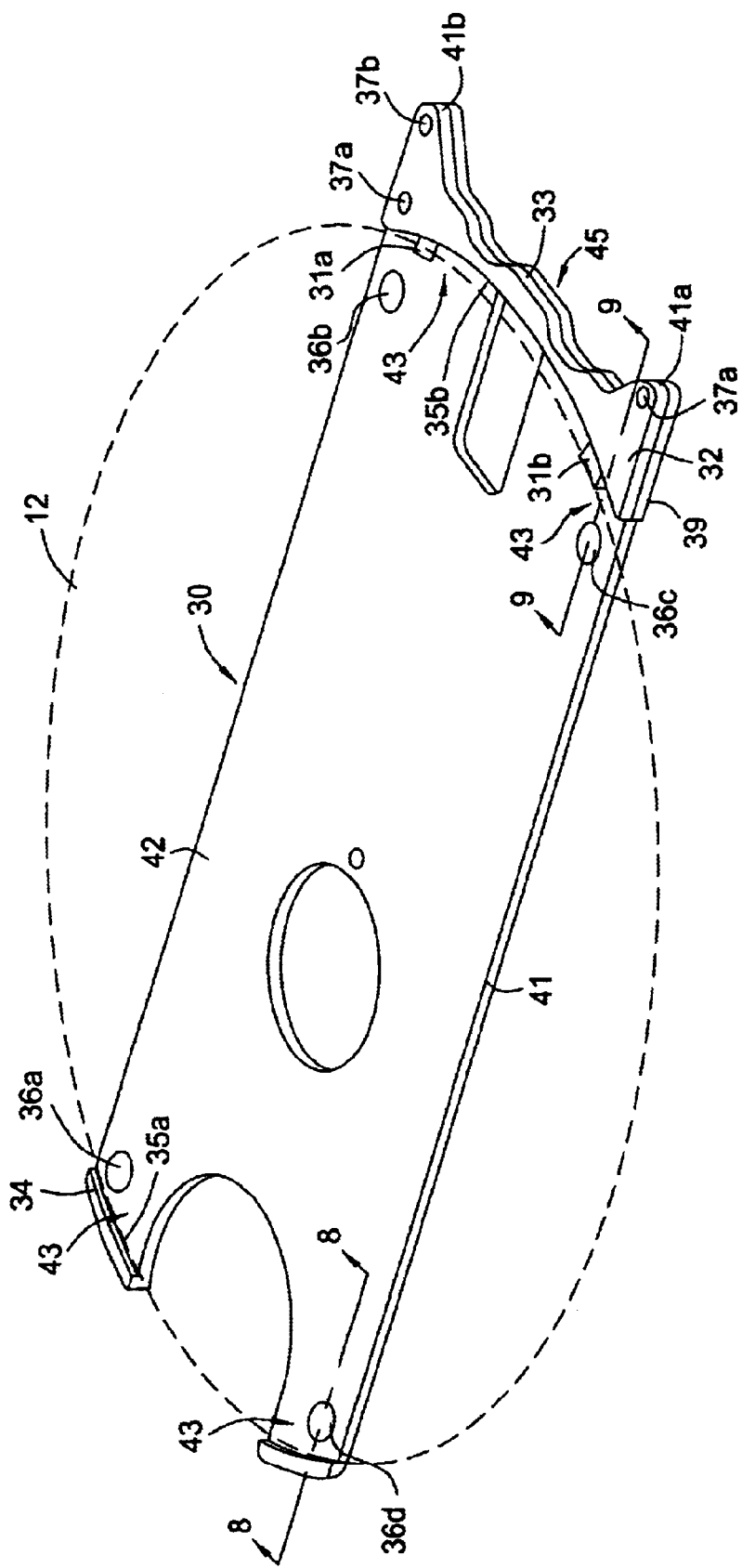
FIG. 7 is a schematic perspective view of one embodiment of a robot blade of the invention.

FIG. 7 is a schematic perspective view of one embodiment of a robot blade of the present invention. The robot blade 30 comprises a generally flat blade surface 42 defined at either end by a first lateral shoulder 32 and a second lateral shoulder 34. The second lateral shoulder 34 is typically referred to as a "front shoe". Grippers 31a, 31b are disposed at least partially in the first lateral shoulder 32, preferably spaced apart on each side of the first lateral shoulder. The grippers 31a, 31b cooperate with the second lateral shoulder 34 to retain a substrate 12 on the blade 30. The first and second lateral shoulders 32, 34 can be formed integral with the blade 30 or connected to the blade surface 42. The lateral shoulders are preferably arcuate in shape to support a circular substrate 12. However, the lateral shoulders can be any shape to conform to the shape of the substrate being supported. The base 33 of the blade 30 is configured with two rearwardly facing lateral protrusions 41a, 41b and a recessed portion 45 on the lateral shoulder 32 to mount the blade to a wrist or other mounting member of a robot assembly (not shown) via fasteners (not shown) such as screws disposed through holes 37a, 37b. A mounting plate 39 is interspaced between the base 33 and the mounting member of the robot assembly to reduce stresses from the blade 30 imparted to the base 33. The mounting plate 39 is preferably made of a flexible polyimide material, such as Kapton®, available from E.I. DuPont de Nemours, Inc. and/or its subsidiaries.

One or more contacts, such as contacts 36a–d, are disposed on the blade 30 inward from the edges 35a, 35b of the lateral shoulders 32, 34, respectively. A particle collection area 43 or trough is disposed on the blade surface 42 primarily between the edges of the blade 30 and the contacts 36a–d and can form an accumulation area for particles generated as the substrate 12 moves across the contacts 36a–d on the blade 30. Preferably, the robot blade 30 includes at least four contacts 36a–d. However, a substrate 12 could be supported on as few as three contacts. The contacts 36a–d can be made integral to the blade 42 or can be affixed to the blade by, for example, pressing, brazing, soldering, or adhesively attaching the contact to the blade. The contacts 36a–d can also be attached or integrated to the blade 42 by plasma spraying, flame spraying, arc spraying, or other methods known in the industry.

Figure 8:
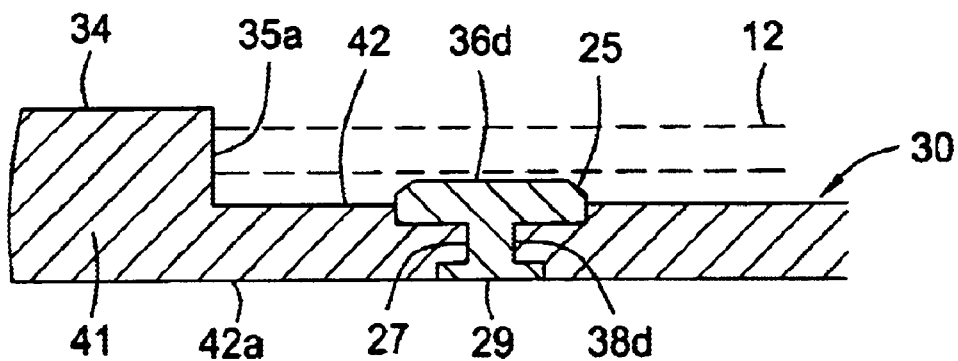
FIG. 8 is a schematic cross sectional view of the embodiment of FIG. 7.
Figure 9:
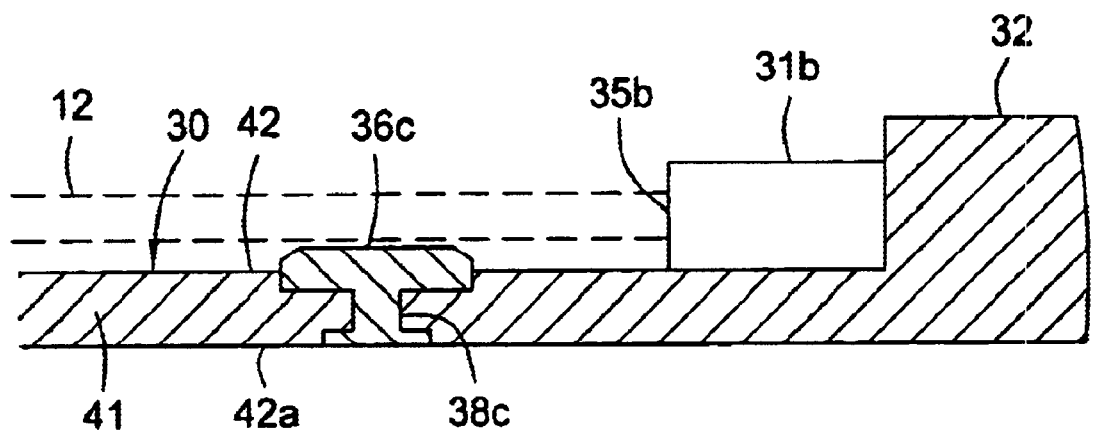
FIG. 9 is a schematic of another cross sectional view of the embodiment of FIG. 7.

FIGS. 8 and 9 are partial cross sectional views of the embodiment of FIG. 7, showing the "T" shaped contacts 36c–d. The contacts 36c–d have a head 25 disposed at least partially above the blade surface 42, a stem 27 disposed through a hole 38d, and a base 29 formed by deforming the stem 27 in place on the backside 42a of the blade 30. This process is typically referred to as "swaging".

Figure 10:
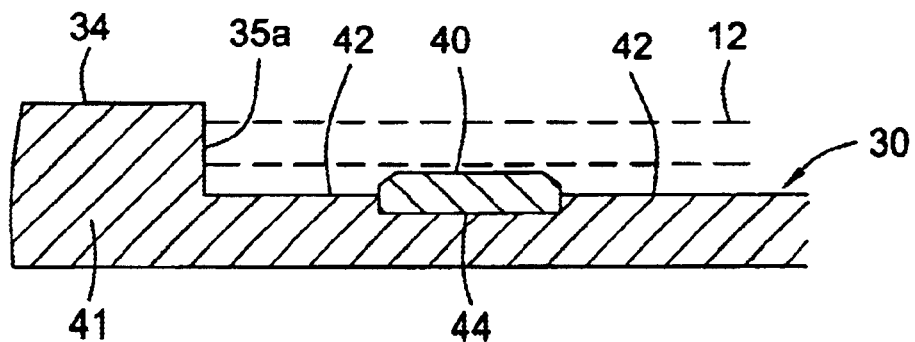
FIG. 10 is a schematic cross sectional view of an alternative embodiment of the invention.

FIG. 10 is a partial cross sectional view of another embodiment of a contact 40, where the contact 40 is brazed, soldered, adhesively attached, or otherwise affixed to the blade 30 in a recess 44 formed in the blade surface 42. The contacts could also be affixed to the blade surface 42 without the recess 44.

The contact head 25 preferably has a flattened upper surface as shown in FIGS. 8–10 to reduce the localized stresses on the substrate 12 and avoid damaging the substrate as it slides across the contacts 36a–d. Alternatively, the head 25 could be convex, semi-spherical, spherical, or other geometric shapes. Furthermore, the contacts 36a–d could be rotatable ball bearings (not shown) that rotate in a hole in the blade 30 to further reduce friction. The contacts 36a–d should extend at least partially above the blade surface 42 to provide clearance between the substrate 12 and the blade surface 42.

The blade 30 is preferably made of a stable, lightweight material that reduces blade deflection under varying chamber conditions including pressure and temperature. One group of materials which can be used to advantage in the invention is ceramics. The ceramics are preferably semi-conductive to facilitate the discharge of any electrostatic charge which may build up on a substrate. The semi-conductive properties preferably avoid a high conductance that can result in arcing between the blade and other system components.

A semi-conductive material for the blade 30 preferably has a resistivity of about $1 \times 10^6$ ohms per square centimeter ($\Omega$/sq. cm.) to about $1 \times 10^7$ $\Omega$/sq. cm. at the operating conditions of the particular application, although other resistivities may be used depending on the amount of conductance desired. One preferred material for the blade is alumina doped with titanium which increases the conductivity of the otherwise insulative or non-conducting alumina. Other semi-conductive ceramic materials include, for example, alumina-SiC composites, SiC, various insulative materials that have been doped to lower the resistivity, such as carbon-doped aluminum nitride, silicon nitride, boron nitride, and boron.

The term "semi-conductive" herein is meant to include the bulk material of the particular component which exhibits semi-conductive electrical properties as well as conductive or non-conductive bulk material that is rendered semi-conductive by, for instance, a coating of semi-conductive material or other semi-conductive electrical paths such as wiring, layers, ribbons, lines, or other electrical channels disposed thereon or therethrough. Similarly, the term "conductive" herein is meant to include conductive bulk material or a semi-conductive or non-conductive material which is rendered conductive by a conductive coating or a conductive electrical path formed therethrough or thereon.

The contacts 36a–d can be made of a variety of metallic or non-metallic materials. To facilitate discharging an electrostatic charge on the substrate 12, the contact is preferably at least semi-conductive and can be conductive. The material should also be wear resistant to minimize particle formation as the substrate slides across the surface of the contact. Materials which can be used to advantage include, for example, conductive materials such as aluminum, titanium, beryllium, stainless steel, and semi-conductive materials such as SiC, titanium-doped alumina, alumina-SiC composites, carbon-doped AlN, SiN, BN, boron, and other wear resistant and/or conductive or semi-conductive materials. A preferable conductive contact material is 6061 aluminum because of its good conductivity and wear properties.

Figure 11:
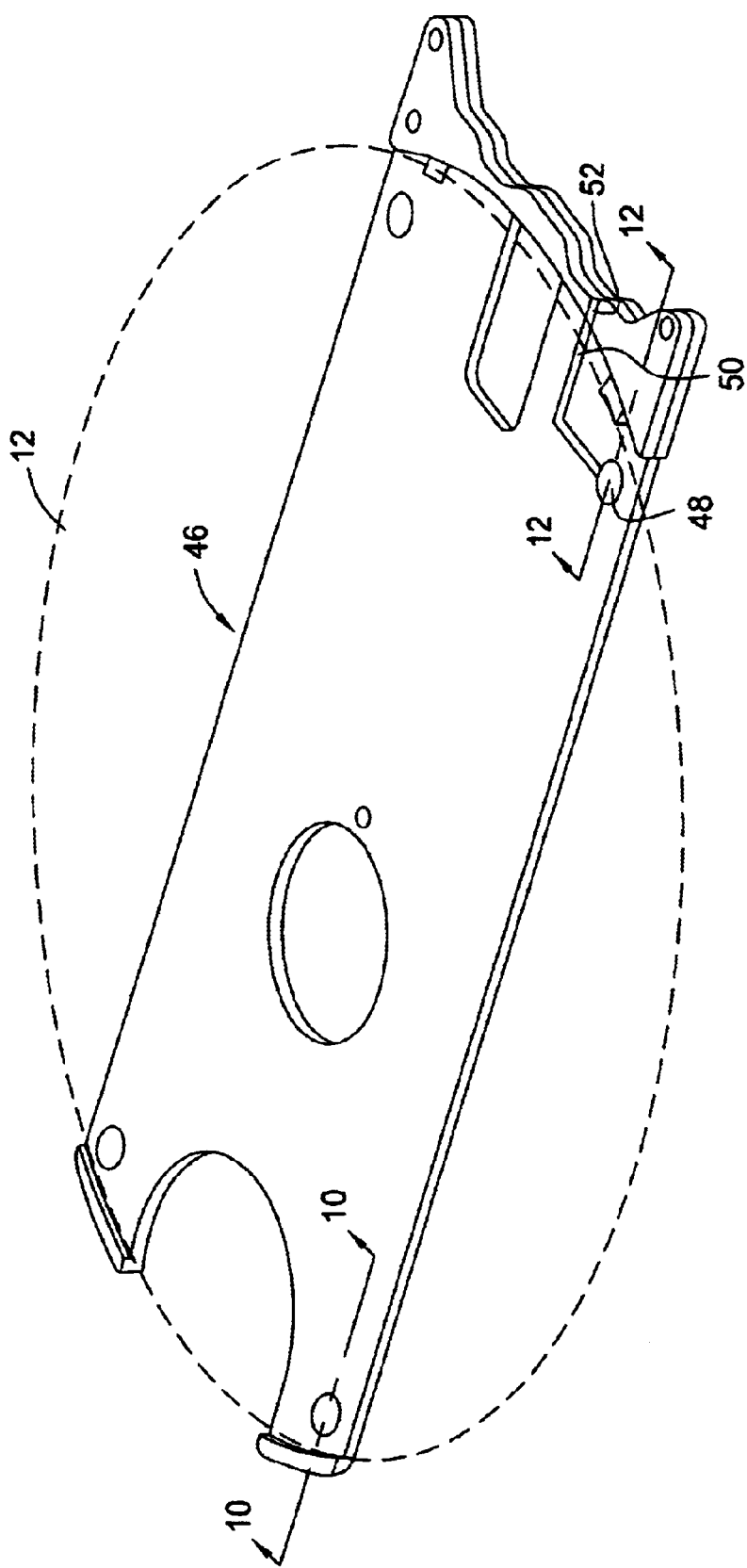
FIG. 11 is a schematic perspective view of another embodiment of the invention.

FIG. 11 is a schematic perspective view of another embodiment of the invention which also allows dissipation of an electrostatic charge while reducing arcing. The robot blade 46 can be similar to the robot blade 30 referenced in FIG. 7 with at least one semi-conductive line 50 disposed therealong to conduct an electrostatic charge from the substrate 12 supported by a contact 48 to the some pickup area 52 on the robot blade 46 that can then transfer the charge to a robot (not shown) which is preferably grounded.

Figure 12:
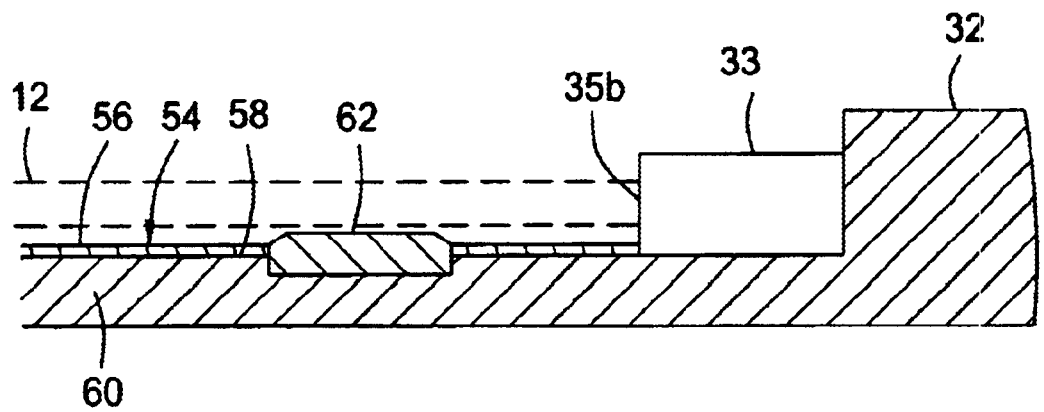
FIG. 12 is a schematic cross sectional view of an alternative embodiment of the invention.

FIG. 12 is a schematic partial cross sectional view of an alternative embodiment of the invention which also allows dissipation of an electrostatic charge on a substrate. The robot blade 54 has a coating 56 disposed on the surface 58 of the blade bulk material 60. A contact 62 is affixed to the blade 54 as described above in reference to FIG. 10. The materials can be the semi-conductive materials or the conductive materials listed in reference to FIGS. 8–10. Where conductive bulk materials are used to form the blade 54, a coating 56 of semi-conductive material is preferably deposited over the bulk material 60 to avoid arcing between the blade 54 and the substrate 12. The coating may be applied by plasma spraying, flame spraying, arc spraying, chemical vapor deposition, or other methods known in the industry. In this embodiment, one combination of materials that would allow the electrostatic charge to be at least partially dissipated through the robot blade 54 while avoiding arcing between the substrate 12 and the robot (not shown) includes the bulk material 60 being conductive, the coating 58 being conductive or semi-conductive, and the contact 62 being semi-conductive. The bulk material 60 could also be semi-conductive in the exemplary embodiment referenced in FIG. 12.

A variation of the combination of materials could include the bulk material 60 being substantially non-conductive or otherwise insulative. If the blade 54 is made of insulative materials, such as alumina, zirconia, SiN, AlN, BN, or quartz, then conductive or semi-conductive coatings 56 and/or contacts 62 could be used to give the blade 54 static dissipative properties. The coating materials could include the materials listed previously for the blade and contacts. A preferred coating material could be carbon-doped AlN or SiN. Preferably, the combination of materials in an embodiment with a coating could be: 1) a conductive bulk material 60 with a semi-conductive coating 56 and a semi-conductive contact 62, 2) a non-conductive bulk material 60 with a conductive or semi-conductive coating 56 and a semi-conductive contact 62, or 3) a non-conductive bulk material 60 with a semi-conductive coating 56 and a conductive or semi-conductive contact 62. Other variations are possible and vary according to the application and the system used.

Figure 13:
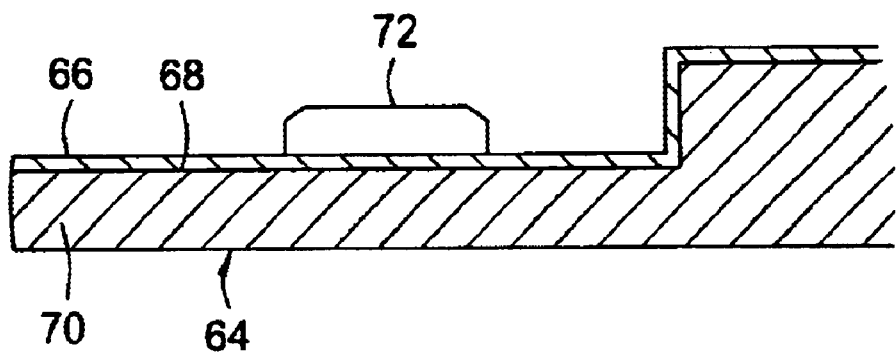
FIG. 13 is a schematic cross sectional view of an alternative embodiment of the invention.

FIG. 13 is a schematic partial cross sectional view of another embodiment of the invention which also allows dissipation of an electrostatic charge on a substrate while reducing arcing. The robot blade 64 has a coating 66 affixed to the surface 68 of the blade bulk material 70. A contact 72 is affixed to the surface of the coating 66. In this embodiment, the contact 72 can be substantially electrically insulated from the bulk material 70. Thus, the bulk material 70 can be conductive or non-conductive independent of the coating 66 and/or contact 72 material. For instance, the bulk material 70 can be insulative or semi-conductive or conductive, the coating 66 can be conductive or semi-conductive, and the contact 72 can be semi-conductive. Alternatively, the bulk material 70 may be insulative, the coating 66 can be semi-conductive, and the contact 72 can be either conductive or semi-conductive.

Figure 14:
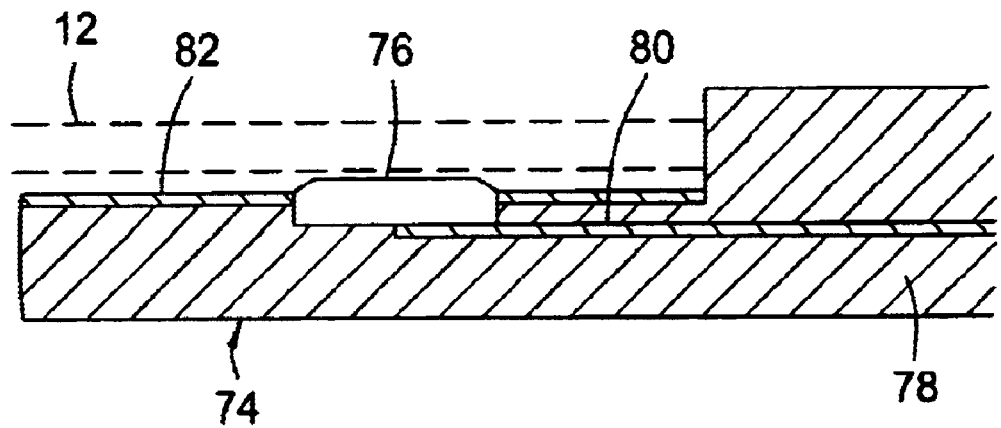
FIG. 14 is a schematic cross sectional view of an alternative embodiment of the invention.

FIG. 14 is a schematic cross sectional view of another embodiment of the invention which also allows dissipation of an electrostatic charge while reducing arcing. The blade 74 has a contact 76 affixed to the blade bulk material 78. A conductive line 80 is in electrical communication with the contact 76 to conduct an electrostatic charge through the blade and to a robot (not shown). This embodiment is primarily useful for the insulative bulk material 78, although if the bulk material 78 is semi-conductive or conductive, variations of the contact material and line material can be made similar to the combinations referenced in FIGS. 7–13. For instance, if the bulk material 78 is insulative, then 1) the contact 76 can be semi-conductive and the line 80 can be conductive or semi-conductive, or 2) the contact 76 can be conductive and the line 80 can be semi-conductive. If the bulk material 78 is conductive, then preferably the contact 76 is semi-conductive. If the bulk material 78 is conductive, then an optional coating 82 that is insulative or semi-conductive can be deposited over the bulk material to isolate the substrate 12 from the conductive bulk material and reduce unwanted arcing.

Figure 15:
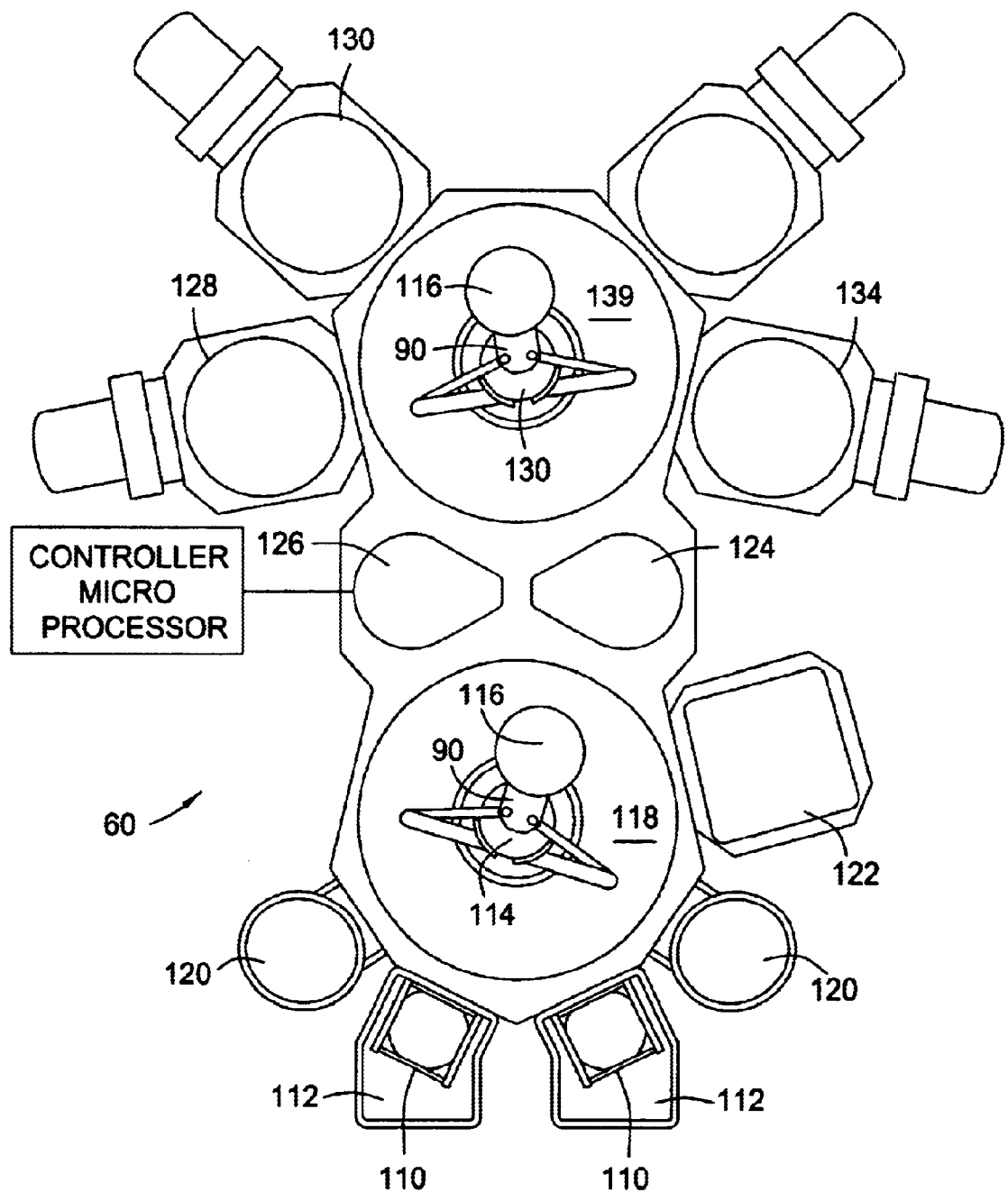
FIG. 15 is a schematic of an exemplary substrate processing system in which the invention may be used.

FIG. 15 is a schematic diagram of an exemplary integrated cluster tool 60, such as an Endura® processing system, which can be used to advantage with the present invention and is available from Applied Material, Inc. of Santa Clara, Calif., the assignee of the present invention. A robot 114 can be incorporated into a first transfer chamber 118 of a cluster tool 60 to allow transfer of substrates 116 from one location to another. Substrates 116 are introduced into and withdrawn from the cluster tool 60 through a cassette loadlock 112, housing a cassette 110. A robot 114 having a robot blade 90 according to the invention is located within the cluster tool 60 to transfer the substrates from one processing chamber to another chamber, such as a cassette loadlock 112, a degas substrate orientation chamber 120, a pre-clean chamber 124, a PVD chamber 122, and/or a cool-down chamber 126. The robot blade 90 is illustrated in the retracted position for rotating freely within the chamber 118. A second robot 130 having a robot blade 90 is located in a second transfer chamber 139 to transfer substrates between various chambers, such as a cool-down chamber 126, PVD chamber 128, PVD chamber 130, CVD chamber 132, and/or PVD chamber 134. The specific configuration of the chambers in FIG. 15 is merely illustrative and comprises an integrated processing system capable of both CVD and PVD processing in a single cluster tool. In a preferred aspect of the invention, a microprocessor controller is provided to control the fabricating process sequence, conditions within the cluster tool, and operation of the robots when transferring substrates.

The present invention can be used with single robots, dual robots, dual independent robots, dual blade robots, and various other robot configurations where robot blades are generally employed. Additionally, all movements and positions, such as "under" and "above", described herein are relative to positions of objects such as the robot blade, the substrate support, and the chamber. Accordingly, it is contemplated by the present invention to orient any or all of the components to achieve the desired movement of substrates through a processing system.

While foregoing is directed to the preferred embodiment of the present invention, other and further embodiments of the invention may be devised without departing from the basic scope thereof, and the scope thereof is determined by the claims that follow.

What is claimed is:

1. A robot blade, comprising:
   a body having a blade surface that is at least partially semi-conductive;
   a plurality of conductive contacts adapted to support a substrate and disposed on the body and at least partially above the blade surface which provide an electrical flow path through the contacts and the blade.

2. The robot blade of claim 1, wherein the blade surface has a perimeter and the contacts are disposed inwardly on the perimeter of the blade surface.

3. The robot blade of claim 1, wherein the bade surface defines a collection area adjacent the contacts.

4. The robot blade of claim 1, wherein the blade comprises a conductive material having a semi-conductive coating.

5. The robot blade of claim 1, wherein the contact comprises a material selected from a group consisting of aluminum, titanium, beryllium, stainless steel, and combinations and alloys thereof.

6. The robot blade of claim 1, wherein the contacts are integral to the blade.

7. The robot blade of claim 1, wherein the contacts are disposed at least partially through the blade.

8. A substrate processing system, comprising:
   a) a chamber;
   b) a robot disposed in the chamber; and
   c) a robot blade connected to the robot, comprising:
      i) a body having a blade surface that is at least partially semi-conductive;
      ii) a plurality of conductive contacts adapted to support a substrate and disposed on the body and at least partially above the blade surface which provide an electrical flow path through the body and the contacts provide an electrical flow path.

9. The system of claim 8, wherein the blade surface has a perimeter, the contacts being disposed inwardly from the perimeter of the blade surface.

10. The system of claim 8, wherein the blade surface defines a collection area adjacent the contacts.

11. The system of claim 8, wherein the blade comprises a conductive material having a semi-conductive coating formed at least partially thereon.

12. The system of claim 8, wherein the contact comprises a material selected from a group consisting of aluminum, titanium, beryllium, stainless steel, and combinations and alloys thereof.

13. The system of claim 8, wherein the contacts are integral to the blade.

14. The system of claim 8, wherein the contacts are disposed at least partially through the blade.

15. The system of claim 8, wherein the robot is grounded.

16. An apparatus, comprising:

means for receiving a substrate, the receiving means having a surface which is at least partially semi-conductive;

means for supporting the substrate, the supporting means being at least partially conductive, the supporting means disposed on the receiving means and at least partially above the surface of the receiving means, the receiving means and the supporting means providing an electrical flow path therethrough.

17. The apparatus of claim 16, wherein the surface of the receiving means has a perimeter and the supporting means are disposed inwardly from the perimeter of the receiving means.

18. The apparatus of claim 16, wherein the surface of the receiving means defines a collection area adjacent the supporting means.

19. The apparatus of claim 16, wherein the receiving means comprises a conductive material having a semi-conductive coating.

20. The apparatus of claim 16, wherein the supporting means comprises a material selected from a group consisting of aluminum, titanium, beryllium, stainless steel, and combinations and alloys thereof.

21. The apparatus of claim 16, wherein the supporting means is integral to the receiving means.

22. The apparatus of claim 16, wherein the supporting means is deposited at least partially through the receiving means.

23. The apparatus of claim 16, further comprising:

a chamber; and means for transferring a substrate, the transferring means disposed in the chamber and being grounded, the receiving means connected to the transferring means.

* * * * *